US010458849B2

(12) United States Patent
Siegel et al.

(10) Patent No.: US 10,458,849 B2
(45) Date of Patent: Oct. 29, 2019

(54) SENSOR ASSEMBLY FOR CAPTURING SPATIALLY RESOLVED PHOTOMETRIC DATA

(71) Applicant: ZUMTOBEL LIGHTING GMBH, Dornbirn (AT)

(72) Inventors: Martin Siegel, Bodolz (DE); Gerd Zeidler, Höbranz (AT)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 205 days.

(21) Appl. No.: 15/303,806

(22) PCT Filed: Apr. 29, 2015

(86) PCT No.: PCT/EP2015/059359
§ 371 (c)(1),
(2) Date: Oct. 13, 2016

(87) PCT Pub. No.: WO2015/165977
PCT Pub. Date: Nov. 5, 2015

(65) Prior Publication Data
US 2017/0038259 A1    Feb. 9, 2017

(30) Foreign Application Priority Data

Apr. 30, 2014  (DE) .................. 10 2014 208 193
Jun. 23, 2014  (DE) .................. 10 2014 211 972

(51) Int. Cl.
*G01J 3/50*     (2006.01)
*G01J 3/51*     (2006.01)
(Continued)

(52) U.S. Cl.
CPC ............. *G01J 3/51* (2013.01); *G01J 3/0229* (2013.01); *G01J 3/2803* (2013.01);
(Continued)

(58) Field of Classification Search
CPC .... G01J 3/51; G01J 4/04; G01J 3/0229; G01J 3/2823; G01J 3/2803; H03M 7/00; H04N 5/2258; H04N 9/04; H04N 5/00
(Continued)

(56) References Cited

U.S. PATENT DOCUMENTS 7,106,377 B2    9/2006  Bean et al.
8,238,026 B1 *  8/2012  Kemme ............... G01J 4/04
                                        250/225
(Continued)

FOREIGN PATENT DOCUMENTS

DE    102004061334    7/2006
DE    102010003804    10/2011
(Continued)

OTHER PUBLICATIONS

Huang, et al., Lensless Imaging by Compressive Sensing, IEEE International Conference on Image Processing, ICIP 2013. Paper #2393 07974, https://arxiv.org/abs/1305.7181 (downloaded Jan. 17, 2017).
(Continued)

*Primary Examiner* — Thanh Luu
*Assistant Examiner* — Kevin Wyatt
(74) *Attorney, Agent, or Firm* — Andrus Intellectual Property Law

(57) ABSTRACT

The invention relates to a sensor assembly (1) for capturing spatially resolved photometric data comprising a sensor unit (10), a controllable shutter assembly (20), which is arranged in front of the sensor unit (10) and by means of which an incidence of light on the sensor unit (10) can be controlled in dependence on direction, and an evaluating unit (30) for evaluating the information output by the sensor unit (10) and calculating spatially resolved brightness information, wherein the sensor unit (10) has at least two sensor segments
(Continued)

(11), with which different combinations of color and polarization filters (12, 13) or spectrometers are associated, and wherein the evaluating unit (30) is designed to supplement the brightness information with additional photometric data on the basis of the signals output by the various sensor segments (11).

9 Claims, 2 Drawing Sheets

(51) Int. Cl.
    *G01J 4/04*     (2006.01)
    *H03M 7/00*     (2006.01)
    *G01J 3/02*     (2006.01)
    *H04N 5/225*     (2006.01)
    *H04N 9/04*     (2006.01)
    *H04N 5/00*     (2011.01)
    *G01J 3/28*     (2006.01)
    *H04N 5/30*     (2006.01)
    *H03M 7/30*     (2006.01)

(52) U.S. Cl.
    CPC ............... *G01J 3/2823* (2013.01); *G01J 4/04* (2013.01); *H03M 7/00* (2013.01); *H04N 5/00* (2013.01); *H04N 5/2258* (2013.01); *H04N 5/30* (2013.01); *H04N 9/04* (2013.01); *G01J 2003/2813* (2013.01); *G01J 2003/2826* (2013.01); *H03M 7/3062* (2013.01)

(58) Field of Classification Search
    USPC ...................................................... 250/208.1
    See application file for complete search history.

(56) References Cited

U.S. PATENT DOCUMENTS

| | | |
|---|---|---|
| 2009/0323060 A1 | 12/2009 | Knipp |
| 2010/0194901 A1* | 8/2010 | van Hoorebeke ... G02B 3/0068 348/218.1 |
| 2012/0300011 A1* | 11/2012 | Moletti ............. H05B 37/0227 348/14.01 |
| 2013/0083312 A1 | 4/2013 | Baraniuk et al. |
| 2013/0229112 A1 | 9/2013 | Van Der Werff |
| 2015/0035440 A1* | 2/2015 | Spero ....................... B60Q 1/04 315/153 |
| 2017/0330364 A1* | 11/2017 | Yamamoto ............ G06T 15/005 |

FOREIGN PATENT DOCUMENTS

| | | |
|---|---|---|
| DE | 102011083137 | 3/2013 |
| WO | 2008014983 | 2/2008 |
| WO | 2009093191 | 7/2009 |
| WO | 2011027260 | 3/2011 |
| WO | 2013158975 | 10/2013 |

OTHER PUBLICATIONS

Germany Search Report on co-pending German application 10 2014 211 972.3 dated Nov. 23, 2016.
Horisaki, et al., Feasibility study for compressive multi-dimensional integral imaging, Optics Express, vol. 16, No. 7, pp. 4479-4486.
International Search Report, PCT/EP2015/059359 dated Jul. 17, 2015.
Austria Search Report, Application GM 345/2014 dated Aug. 4, 2015.

* cited by examiner

SENSOR ASSEMBLY FOR CAPTURING SPATIALLY RESOLVED PHOTOMETRIC DATA

CROSS REFERENCE TO RELATED APPLICATION

The present application is the U.S. national stage application of International Application PCT/EP2015/059359, filed Apr. 29, 2015, which international application was published on Nov. 5, 2015 as International Publication WO 2015/165977 A1. The International Application claims priority of German Patent Applications 10 2014 208 193.9 filed Apr. 30, 2014, and 10 2014 211 972.3 filed Jun. 23, 2014.

FIELD OF THE INVENTION

The present invention relates to a sensor assembly, which is provided for capturing spatially resolved photometric data, thus, by way of example, brightness data, which are used for lighting control.

BACKGROUND

Brightness sensors are used in lighting technology in order to obtain a constant, uniform brightness at specific regions to be illuminated, for example, independently of the daylight arriving from the exterior. This occurs in the framework of a regulation, in that a brightness datum representing the region to be illuminated is captured, and transmitted to control unit for controlling the lamp or lamps. The brightness of the lamps is then modified in accordance therewith, in order to obtain, in each case, a precise, desired brightness, independently of the time of day, for example. Persons located and, for example, working in the illuminated region need not then always re-adjust the artificial light manually, which is accompanied by a clear improvement in the lighting situation.

Simple brightness sensors based on a single photodiode are primarily known from the prior art. Brightness sensors are designed such that they are directed toward a specific region to be monitored, and the signal emitted by the photodiode, the brightness perception of which is potentially adjusted to that of the human eye, then represents the brightness present in the region to be monitored. These are relatively simple sensors, which can be manufactured economically, and used in numerous applications.

One disadvantage, however, with these simple, single photodiode brightness sensors is that these actually emit only one single signal, specifically representing the brightness. Color (coordinate) or color temperature data, on the other hand, or other so-called photometric data, cannot be captured with sensors of this type.

Furthermore, no spatially resolved data can be obtained with these known sensors. That is, if, with a more complex lighting control, the brightness at numerous locations is to be accounted for, then a separate sensor must be used for each individual location that is to be monitored.

For this reason, it has also been proposed in the past to use sensor systems based on image sensors. A sensor unit of this type is described, by way of example, in DE 10 2010 003 804 A1 by the applicant, and is based in principle on a digital camera, or the sensor of such a camera, the image data of which are evaluated in order to obtain data regarding the currently present lighting situation. The advantage with intelligent sensors of this type is that, due to the spatially resolved data made available thereby, the sensor unit can assume the function of numerous individual brightness sensors, and furthermore, the sensors can also be used, for example, to capture movements of persons, and thus also their presence, by appropriately evaluating the image data.

Both the simple brightness sensors described above, as well as the more complex systems based on image sensors, are, however, only capable to a limited extent of distinguishing between artificial light and natural light sources, if they have not been calibrated. Furthermore, with camera systems currently available, the determination of the so-called white point is relatively imprecise, as is also the case for the color or color coordinate information. The precision of the color temperature measurement can, however, be improved with special filters. The possibility of exchanging the filters, however, is limited or impossible with many commercially available camera sensors, because the filter is defined in a fixed manner for each pixel.

The present invention therefore addresses the objective of providing a novel sensor assembly for capturing spatially resolved photometric data, which is also capable of conveying color or color temperature data, and makes it possible to implement these advantages with reasonable effort.

SUMMARY OF THE INVENTION

The objective is achieved by a sensor assembly for capturing spatially resolved photometric data, having the features described hereafter.

The solution according to the invention is based on the idea of capturing the spatially resolved photometric data using a sensor assembly that is composed of relatively few individual sensor segments, in front of which a so-called shutter assembly is disposed, through which a light incidence on the sensor assembly can be controlled as a function of the direction. An assembly of this type, for capturing spatially resolved brightness data, is known fundamentally, by way of example, from the publication "Lensless Imaging by Compressive Sensing" (Gang Huang et al., Bell Labs, Alcatel-Lucent, Murray Hill, N.J. 07974). In comparison with known image sensors, based on a matrix-like arrangement of numerous individual sensor elements, theoretically only one single sensor element is used with this novel method, which, however, is illuminated in a targeted manner, as a function of the direction, via a shutter matrix disposed in front of the sensor element. Because the light incidence from specific directions is selectively allowed to strike the sensor element, or prevented therefrom, a spatially resolved datum can in turn be obtained in the framework of a later evaluation of the sensor signals, and taking into account the light incidence, ultimately enables image data to be reconstructed.

Because, with this approach, the individual sensor element must be repeatedly exposed in successive steps, and the image data can first be reconstructed at the end of such a sequence, the generation of an image is associated with a relatively high expenditure of time. This, however, is acceptable for the use as a sensor for lighting control. Because the number of pixels is significantly reduced with this method, or theoretically only a single sensor element is present, respectively, supplementary measures can now be taken with a reasonable effort, by means of which the improved capturing, in comparison with conventional image sensors, of color or color temperature data, or in general, supplementary photometric data, is enabled. For this, it is provided according to the invention, that the sensor element now has a sensor unit having at least two sensor segments, to each of which, e.g., different combinations of color filters and/or polarization filters are assigned. Based on the signals emitted by the different sensor segments, the brightness data is then supplemented by additional photometric data, thus, e.g., by color or color temperature data. Furthermore, the use of a (light) spectrometer may be provided according to the invention, by means of which any arbitrary filter curve can be obtained in the post-processing. The solution according to the invention thus makes it possible to also capture, in addition to the brightness, the color temperature, polarization, spectral composition and/or other light parameters, for example.

Thus, in accordance with the invention, a sensor assembly for capturing spatially resolved photometric data, preferably for lighting control, is proposed, which has a sensor unit as well as a controllable shutter assembly disposed in front of the sensor unit, through which a light incidence on the sensor unit can be controlled as a function of the direction thereof. The assembly furthermore has an evaluation unit for evaluating the data emitted by the sensor unit, and calculating a spatially resolved brightness datum, wherein the sensor unit has at least two sensor segments, each of which is assigned different combinations of color filters, polarization filters, and/or spectrometers, wherein the evaluation unit is designed to supplement the brightness data with additional photometric data, based on the signals emitted by the different sensor segments.

The invention thus combines the novel technology, with which spatially resolved data can be obtained despite using, theoretically, only one single sensor element, or only a few, with the idea of using additional color and polarization filters or spectrometers in order to optimize the capturing of color or color temperature data. Both technologies are advantageously combined with one another, each of which, taken individually, would not provide satisfactory results. For example, the use of polarization filters, specifically such as those functioning on a pixel level and having different orientations in classic image sensors, would not be economically feasible due to the costs associated therewith. Thus, a sensor assembly is created, which can be manufactured with reasonable effort, having significant advantages with respect to the quality and the data obtained over systems known so far.

The sensor unit preferably has three, or a whole number multiple of three sensor segments, each of which is assigned three different color filters, preferably in the colors red, green and blue. In contrast to the approach described in the article cited above, the sensor unit is thus not formed by a single sensor, but rather, has a slightly more complex design, wherein different color filters are then disposed in front of the sensors, such that, in comparison therewith, color data can also now be obtained.

Furthermore, the sensor assembly preferably has three, or a whole number multiple of three, sensor segments, each of which then are not assigned a polarization filter, or to which one of two polarization filters oriented perpendicular to one another, are assigned. In the same manner as with the color filters, the sensor segments are thus provided with polarization filters having different orientations, or they are not provided with a polarization filter, wherein, by combining the appropriate data from the sensor segments provided with the different polarization filters, data can then be obtained that enables the execution of a precise white balance.

According to a particularly preferred embodiment, the sensor assembly thus has, on the whole, nine different sensor segments, in front of which the aforementioned different combinations are disposed, formed by the different color and polarization filters.

Alternatively, or in addition thereto, the assembly can also be combined with a spectrometer, by means of which there is then the possibility of obtaining supplementary data regarding the spectral composition of the light. In the post-processing of the captured data, arbitrary filter properties can then be implemented.

The shutter assembly disposed in front of the sensor assembly can have a different design, as long as it enables the directionally dependent exposure of the sensor unit. The use of micro-mirrors, mechanical shutters, so-called MEMS systems, or the use of LCD arrays, for example, are contemplated. In all of these cases, it is ensured that, in accordance with the principle specified above, the sensors are exposed successively from different directions, and by combining these data, the spatially resolved image data can then be determined.

BRIEF DESCRIPTION OF THE DRAWINGS

The invention shall be explained below in greater detail based on the attached drawings. Therein.

DETAILED DESCRIPTION

Figure 1:
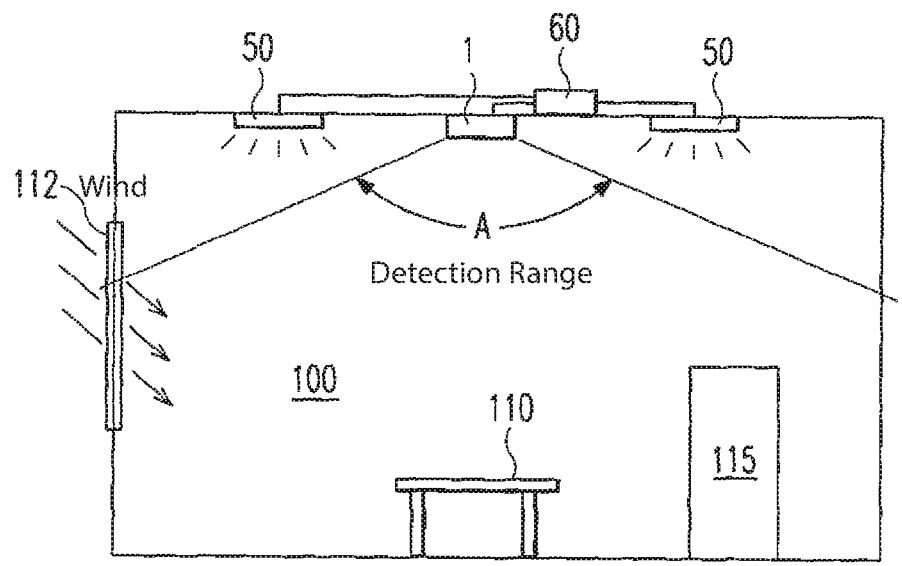
FIG. 1 shows, schematically, the use of a sensor assembly according to the invention for lighting control.

Firstly, FIG. 1 shows, in general, the principle for the use of the sensor assembly according to the invention, which is provided with the reference symbol 1 herein, and is disposed on the ceiling of a room provided with the reference symbol 100. The sensor assembly 1 serves to determine brightness data, as well as supplementary color or color temperature data, which are provided to be used for controlling lamps 50 that are used for illuminating the room 100. The data generated by the sensor assembly 1 are transmitted to a control unit 60, which then assumes a regulation of the brightness control for the lamps 50 based thereon.

The detection region of the sensor assembly 1 is schematically represented by the reference symbol A. As can be seen, this region is extremely large, and ideally covers the entire room 100. This represents the decisive difference to classic light sensors, which are based on the use of individual photodiodes, which are specifically directed toward individual regions that are to be evaluated. The sensor assembly 1 according to the invention specifically captures spatially resolved data regarding the entire detection region, such that then, after an appropriate evaluation by either the sensor assembly 1 itself, or by the control unit 60, data regarding numerous individual regions are obtained, which can then be used in a targeted manner for controlling the lamps. This principle is already known from the aforementioned DE 10 2010 003 804 A1 by the applicant, in which the spatially resolved image data are assigned to individual so-called evaluation regions, which are then evaluated in a targeted manner for the brightness control. By way of example, by means of the spatially resolved brightness data, data regarding the brightness present at a workspace 110, as well as data regarding the daylight entering through a window 112, can be obtained simultaneously. Ultimately, the data generated by the sensor assembly 1 could also be used to determine whether there are persons located in the region of the entry door 115 to the room 100. This means that, as with other known, intelligent sensor assemblies 1 based on image sensors, the present assembly according to the invention is also capable of being used in a multifunctional manner, and providing numerous data that can be used for lighting control.

The distinctive feature of the sensor assembly 1 according to the invention is comprised in the construction thereof, which shall be explained in greater detail below, based on FIGS. 2 and 3.

As has already been mentioned, it has so far been the normal practice to use digital cameras in a simple manner in order to implement intelligent light sensors with systems based on digital image sensors. The image sensors of such cameras are composed in the known manner of an extremely high number of light-sensitive elements, so-called pixels, which are substantially simultaneously exposed through a corresponding lens, and ultimately produce the image. In contrast, the sensor assembly 1 according to the invention is distinguished in that an extremely simply constructed sensor unit, having only a few individual segments, is used, and despite this, spatially resolved data can be obtained.

Figure 2:
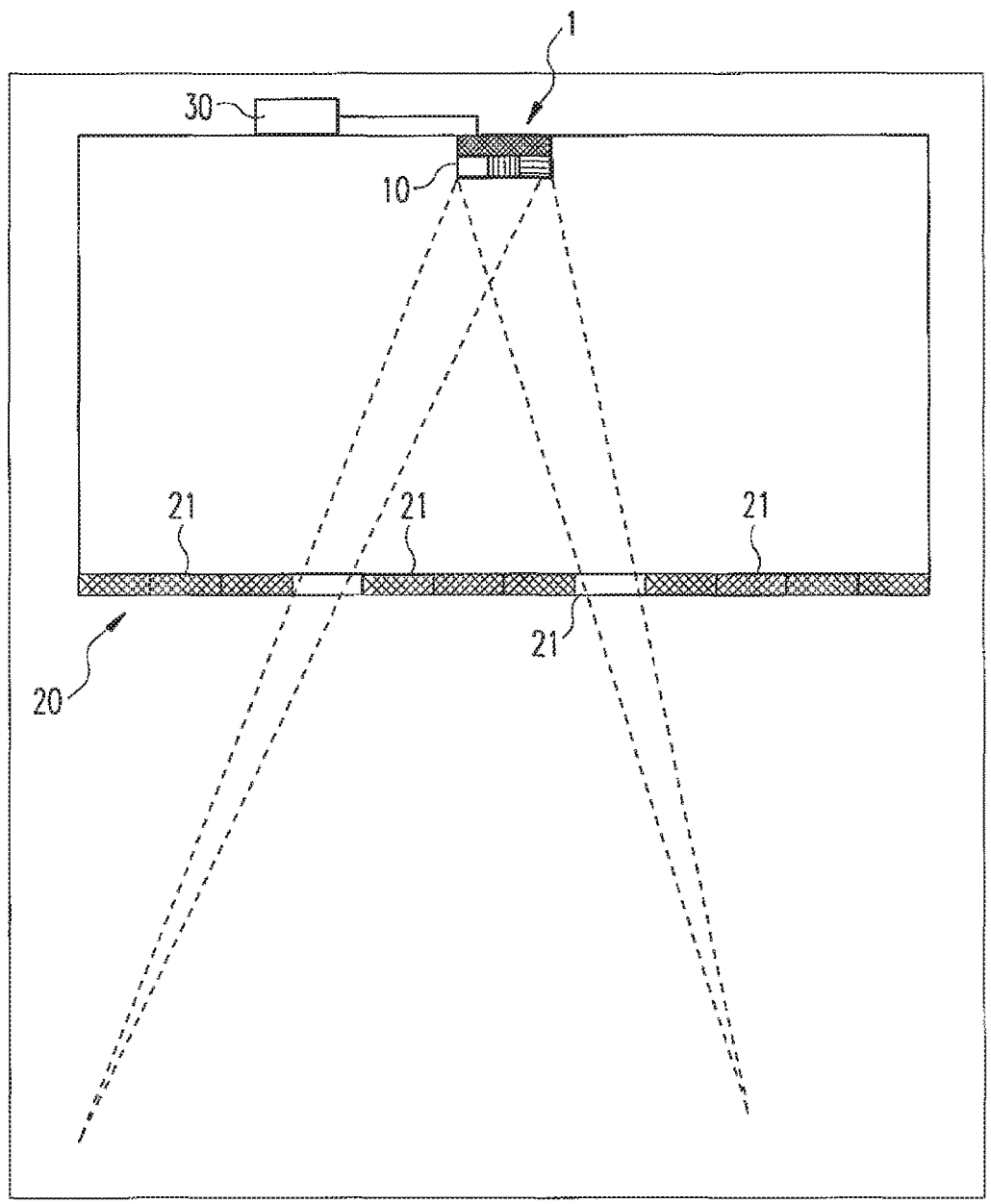
FIG. 2 shows the fundamental construction of the assembly according to the invention for capturing spatially resolved image data.

The principle used for this is schematically illustrated in FIG. 2. The sensor unit 10, which—as shall be explained in greater detail below—is composed of a few, preferably a maximum of nine, individual pixels, or segments, is disposed here behind a so-called shutter assembly 20. The shutter assembly 20 has a certain spacing to the sensor unit 10, and is significantly larger, with respect to its overall dimensions, than the sensor unit 10. It is composed of individual elements 21, which can be selectively controlled, such that they allow, or prevent, a light incidence onto the sensor unit 10. Specifically, these individual elements 21 of the shutter assembly 20 are disposed in the manner of a matrix, such that, depending on which segment 21 currently enables a light incidence, the light strikes the sensor unit 10 from different directions.

In order to determine spatially resolved data, it is then provided that the individual elements 21 of the shutter assembly 20 are activated successively, corresponding to a specific pattern, such that the incidence of light on the sensor unit 10 occurs in a targeted manner from specific directions, or angles. By combining the successively acquired sensor data, an evaluation unit 30 can ultimately produce a two dimensional image of the region captured by the sensor assembly 1. Understandably, this is associated with a certain time expenditure, because in the framework of the special activation of the shutter assembly 20, the opening and closing of the individual elements 21 requires a certain amount of time, and the overall image can first be obtained when all of the individual segments 21 have been opened at least once. This is, however, acceptable for the obtaining of image data for lighting control, because the temporal aspect plays a minor role here. Even certain movements of objects inside the detection region during this time period do not lead to any noticeable distortions of the measurement results, which are ultimately then used for the lighting control.

The individual elements 21 of the shutter assembly 20 can be formed and implemented thereby in different manners. It is contemplated, for example, to use micro-mirrors, mechanical shutter elements, so-called MEMS elements, or LCD arrays. Because a relatively rough spatial resolution is absolutely acceptable for the lighting control, the number of individual segments 21 can also be kept within a reasonable scope. The depicted configuration, with twelve individual elements adjacent to one another, which in the case of a square shutter assembly results in 144 individual elements, is suitable.

In the system described in the article cited above, only one single sensor element is actually used, which is selectively exposed through the shutter assembly as a function of direction. In this case, only brightness data can be obtained, but no additional photometric data.

Figure 3:
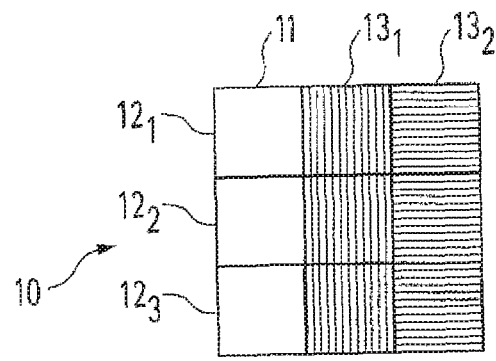
FIG. 3 shows the design of the sensor unit used in the sensor assembly according to the invention.

In a further development of this fundamental principle, it is therefore provided, in accordance with the present invention, that the sensor unit 10 has a slightly more complex design, and ideally, as is shown in FIG. 3, is formed by nine individual segments 11 disposed in the manner of a matrix. These individual segments 11 are arranged in a 3×3 matrix, wherein the dimensions are selected such that when the sensor unit 10 is exposed through the shutter assembly 20, the individual segments 11 are exposed in a similar manner. This means, as is schematically depicted in FIG. 2, that the individual segments 21 of the shutter assembly 20 are designed such, and the geometric dimensions are selected such, that an individual segment 21 always entirely and uniformly exposes the sensor unit 10, such that, in principle, each individual sensor segment 11 is exposed in the same manner.

In fact, the individual sensor segments 11 convey different measurement data, however, which can be attributed to the fact that different combinations of color and polarization filters are disposed in front of them. From a practical perspective, the individual filters are provided in strips thereby, such that they always cover a row or a column in the sensor matrix. By way of example, three color filters $12_1$, $12_2$, $12_3$ are disposed behind one another in the three rows, which filters are red, blue and green, for example. Furthermore, perpendicular thereto, polarization filters are disposed in the three columns, wherein, specifically, polarization filters are only disposed in the middle and right-hand column, and there is no polarization filter in the left-hand column. The two other polarization filters $13_1$ and $13_2$ are oriented perpendicular to one another—as can be seen in the drawing.

Ultimately, this arrangement of color and polarization filters results in each sensor segment 11 being provided with a specific combination of color and polarization filters (wherein this also comprises a variation in which there is no polarization filter). Thus, the individual segments 11, which are exposed in the same manner by the shutter assembly, nevertheless produce different measurement signals, due to the different filter combinations disposed in front of them.

The taking into account of these different measurement signals by the evaluation unit of the sensor assembly 1 first results in it being possible to determine the color coordinates of the light that can enter through the corresponding element 21 of the shutter assembly, by taking into account the different color filters. The taking into account of the different signals with respect to the polarization directions, in contrast, makes it possible to draw conclusions regarding, on one hand, whether the incident light is artificial or natural. Furthermore, in the framework of a corresponding evaluation, the color temperature can also be determined with significantly greater precision. This means that a white balance can now be carried out, which is significantly more precise than was the case with former methods based on image sensors. The combining of the signals emitted from the nine different sensor segments is achieved, as mentioned above, by means of an internal evaluation unit of the sensor assembly, which ultimately creates, on the whole, a spatially resolved image, in turn, which now contains not only brightness data, but also color and color temperature data.

Furthermore, it would also be conceivable, as mentioned above, to combine the sensor segments 11 with a spectrometer. This leads to special advantages, because a spectrometer represents a relatively expensive component. A spectral pixel sensor could now be implemented with the principle according to the invention, which can be manufactured significantly more economically with respect to the associated costs, than comparable solutions, in which an individual spectrometer is used for each pixel.

Based on this image, a brightness control can then be carried out in the manner described above. As has already been mentioned, the spatial resolution of the image created by the sensor device according to the invention is rather low, and the time expenditure for creating an image is relatively high. These disadvantages play a rather minor role, however, for the lighting control. They are clearly outweighed by the resulting advantages, specifically that the brightness data as well as the additionally obtained photometric data are significantly more meaningful than was the case with the systems available so far. This is a substantial aspect for the lighting control, because it is by this means that it can be ensured that at regions that are to be illuminated, the desired conditions are actually present, not only with regard to brightness, but also the color of the light.

What is claimed is:

1. A lighting system for a room comprising one or more lamps, a sensor assembly (1) for capturing spatially resolved brightness data supplemented with photometric data in a detection region of the room, and a control unit that operates the one or more lamps, wherein the sensor assembly (1) comprises:

a sensor unit (10), wherein the sensor unit (10) has at least nine sensor segments (11) to which are assigned different combinations of at least three different color filters (12) and at least two polarization filters (13) which are oriented perpendicular to one another, and at least three sensor segments are assigned to each respective filter color, and one of the three segments assigned to each respective filter color detects light that passes through the respective color filter and no polarization filter, a second of the three segments assigned to each respective filter color detects light that passes through the respective color filter and one of the polarization filters, and a third of the three segments assigned to each respective filter color detects light that passes through the respective color filter and one of the polarization filters; and a controllable shutter assembly (20) disposed in front of the sensor unit (10), through which a light incidence on the sensor unit (10) can be controlled as a function of the direction, wherein the controllable shutter assembly (20) has numerous controllable individual shutter elements (21), which selectively enable light incidence onto the sensor unit (10) such that the light incidence enabled through the individual elements (21) substantially illuminates the sensor unit (10) in a uniform manner, and the individual shutter elements are activated successively such that the sensor unit is exposed for each successive activation in a targeted manner to part of the detection region and the entire detection region is exposed to the sensor unit through the successive activation of all the individual shutter elements;

and the system further comprises an evaluation unit (30) for evaluating the data emitted from the sensor unit (10) for the sensor segments, and calculating a spatially resolved brightness datum, and further wherein the evaluation unit (30) is designed to supplement the brightness data with additional photometric data, on the basis of the signals emitted from the different sensor segments (11), and spatially resolved brightness data supplemented with photometric data is provided to the control unit for controlling the one or more lamps in the room.

2. The lighting system according to claim 1, wherein the sensor unit (10) has at least 3*n sensor segments (11), to which three different color filters (12), comprising red, green and blue filters, are assigned.

3. The lighting system according to claim 2, wherein the sensor unit (10) has nine sensor segments (11) and no more than nine sensor segments.

4. The lighting system according to claim 3, wherein the nine sensor segments (11) are disposed in the manner of a matrix.

5. The lighting system according to claim 4, wherein the color and polarization filters (12, 13) each cover a row or column of the sensor segment (11) arrangement.

6. The lighting system according to claim 1, wherein the sensor unit (10) has at least 3*n sensor segments (11), to which no polarization filter is assigned, or to which one of two polarization filters (13) are assigned, which filters are oriented perpendicular to one another.

7. The lighting system according to claim 1, wherein the individual shutter elements (21) of the shutter assembly comprises one of the following: micro-mirrors, mechanical shutters, MEMS systems, or an LCD array.

8. The lighting system according to claim 1 wherein further comprising a spectrometer assigned to each sensor segment.

9. The lighting system according to claim 1 wherein the evaluation unit is part of the sensor assembly.

* * * * *